United States Patent
Kim et al.

(10) Patent No.: US 10,196,272 B2
(45) Date of Patent: Feb. 5, 2019

(54) APPARATUS AND METHOD OF MANUFACTURING GRAPHENE FILM

(71) Applicants: Wan Soo Kim, Seogwipo-si (KR); Jung Hee Han, Seoul (KR); Byung Hee Hong, Suwon-si (KR)

(72) Inventors: Wan Soo Kim, Seogwipo-si (KR); Jung Hee Han, Seoul (KR); Byung Hee Hong, Suwon-si (KR)

(73) Assignee: Graphene Square, Inc., Seoul (KR)

(*) Notice: Subject to any disclaimer, the term of this patent is extended or adjusted under 35 U.S.C. 154(b) by 27 days.

(21) Appl. No.: 15/149,612

(22) Filed: May 9, 2016

(65) Prior Publication Data
US 2017/0029279 A1    Feb. 2, 2017

(30) Foreign Application Priority Data
Jul. 31, 2015   (KR) .................... 10-2015-0108710

(51) Int. Cl.
*C23C 16/26* (2006.01)
*H01J 37/32* (2006.01)
*C23C 16/50* (2006.01)
*C01B 32/186* (2017.01)
*B32B 37/00* (2006.01)
*B32B 37/10* (2006.01)

(52) U.S. Cl.
CPC .......... *C01B 32/186* (2017.08); *B32B 37/025* (2013.01); *B32B 37/10* (2013.01); *C23C 16/26* (2013.01)

(58) Field of Classification Search
None
See application file for complete search history.

(56) References Cited

U.S. PATENT DOCUMENTS

| | | | | |
|---|---|---|---|---|
| 3,598,006 A | * | 8/1971 | Gerber | B26D 7/018 269/21 |
| 3,765,289 A | | 10/1973 | Gerber et al. | |
| 3,809,050 A | * | 5/1974 | Chough | B28D 5/0094 118/35 |
| 3,851,758 A | * | 12/1974 | Makhijani | H01L 21/3043 134/169 R |
| 4,049,484 A | | 9/1977 | Priest et al. | |

(Continued)

FOREIGN PATENT DOCUMENTS

KR    10-1262327    5/2013

OTHER PUBLICATIONS

Office Action dated Jul. 6, 2016 for Korean Patent Application 10-2015-0108710; 4 pgs; Korean Intellectual Property Office, Daejeon, Republic of Korea.

(Continued)

*Primary Examiner* — Sylvia MacArthur
(74) *Attorney, Agent, or Firm* — Andrew D. Fortney; Central California IP Group, P.C.

(57) ABSTRACT

Disclosed is an apparatus and method of manufacturing a graphene film, wherein the apparatus includes a wrinkle flattening device configured to flatten wrinkles in a lamination structure including a base substrate and a graphene film laminated on the base substrate; and a first lamination apparatus configured to laminate a first substrate on the graphene film, wherein the wrinkle flattening device applies a vacuum to the base substrate when the wrinkle flattening device is in contact with the base substrate.

14 Claims, 7 Drawing Sheets

(56) References Cited

U.S. PATENT DOCUMENTS

| | | | |
|---|---|---|---|
| 4,667,944 A | 5/1987 | Althouse | |
| 4,718,629 A | 1/1988 | Block et al. | |
| 4,881,770 A | 11/1989 | Marzinotto et al. | |
| 5,205,896 A | 4/1993 | Brown et al. | |
| 5,382,404 A | 1/1995 | Kogame | |
| 5,534,102 A * | 7/1996 | Kadono | H01L 21/302 156/250 |
| 6,032,715 A | 3/2000 | Ohkubo et al. | |
| 6,382,609 B1 | 5/2002 | Namioka et al. | |
| 6,649,017 B1 * | 11/2003 | Kurokawa | H01L 21/67092 156/711 |
| 7,223,319 B2 | 5/2007 | Kurosawa et al. | |
| 7,393,757 B2 * | 7/2008 | Miyamoto | B32B 43/006 438/460 |
| 7,406,759 B2 | 8/2008 | Yamamoto et al. | |
| 7,607,647 B2 | 10/2009 | Zhao et al. | |
| 7,988,807 B2 * | 8/2011 | Noda | B32B 43/006 156/153 |
| 7,992,877 B2 | 8/2011 | Balan | |
| 8,101,436 B2 * | 1/2012 | Takekoshi | B28D 5/0082 257/E21.214 |
| 8,110,777 B2 | 2/2012 | Zuehlke et al. | |
| 8,177,607 B2 | 5/2012 | Herbin et al. | |
| 8,240,650 B2 | 8/2012 | Teich et al. | |
| 8,268,114 B2 | 9/2012 | Masumura et al. | |
| 8,500,182 B2 | 8/2013 | Yang et al. | |
| 8,916,013 B2 * | 12/2014 | Hong | B82B 3/0076 156/239 |
| 8,926,854 B2 * | 1/2015 | Hong | B29B 15/08 216/90 |
| 9,245,787 B2 | 1/2016 | Jeon et al. | |
| 2006/0070704 A1 * | 4/2006 | Sinclair | B25B 11/007 156/539 |
| 2012/0258311 A1 | 10/2012 | Hong et al. | |
| 2015/0068684 A1 | 3/2015 | Hong et al. | |

OTHER PUBLICATIONS

Byung Hee Hong, et al; Graphene Roll-to-Roll Transfer Method, Graphene Roll-to-Roll Transfer Apparatus, and Graphene Roll; Bibliographic Data of KR101262327 (B1); May 8, 2013; http://worldwide.espacenet.com.

* cited by examiner

APPARATUS AND METHOD OF MANUFACTURING GRAPHENE FILM

CROSS REFERENCE TO RELATED APPLICATIONS

This application claims the benefit of the Korean Patent Application No. 10-2015-0108710 filed on Jul. 31, 2015, which is hereby incorporated by reference as if fully set forth herein.

BACKGROUND

Field of the Disclosure

Embodiments of the present invention relate to an apparatus and method of manufacturing a graphene film, and more particularly, to an apparatus and method of manufacturing a graphene film capable of flattening wrinkles.

Discussion of the Related Art

Fullerene, carbon nanotube, graphene, and graphite are known as a material comprised of carbon atoms. Graphene is a conductive material having a structure in which carbon atoms are arranged in a honeycomb shape on a two-dimensional plane.

Graphene is structurally and chemically very stable. Also, graphene is a good conductor capable of transferring an electron more rapidly in comparison to silicon, and also enabling more current flowing in comparison to copper. Also, graphene has transparency and nano pattern so that it enables an easy processing. Accordingly, it has been tried to apply graphene having the aforementioned many advantages to a sensor, a memory, and a flat display device.

In order to apply graphene to various fields, a method of mass synthesis of graphene is necessary. A related art thin graphene film is obtained through the following processes: graphite is ground mechanically, the ground graphite is dispersed in a solution, and then a thin film of graphene film is synthesized by a self-assembly phenomenon. In this case, it is difficult to satisfy a desired level of the electrical and mechanical properties in the obtained graphene film.

Accordingly, the present applicant proposed a method of synthesizing a graphene film on a metal catalyst base by a chemical vapor deposition method, and also proposed a method of forming a graphene film on a desired substrate.

FIGS. 1A to 1E illustrate a process of forming a graphene film on a desired substrate proposed by the present applicant.

First, as shown in FIG. 1A, a graphene film 2 is deposed on an upper surface of a metal catalyst base 1 by a chemical vapor deposition method.

Then, as shown in FIG. 1B, a support substrate 3 is deposited on an upper surface of the graphene film 2.

As shown in FIG. 1C, the metal catalyst base 1, which is provided on a lower surface of the graphene film 2, is removed by etching.

Then, as shown in FIG. 1D, a target substrate 4 is deposited on the lower surface of the graphene film 2 from which the metal catalyst base 1 is removed.

Then, as shown in FIG. 1E, the support substrate 3 is separated (peeled-off) from the upper surface of the graphene film 2, to thereby obtain the graphene film 2 formed on the desired target substrate 4.

In case of the above method shown in FIGS. 1A to 1E, the graphene film 2 is formed on the finally-desired target substrate 4 through the deposition process of the graphene film 2 by the chemical vapor deposition method, the etching process of the metal catalyst base 1, the deposition process of the target substrate 4, and the separation process of the support substrate 3.

This method inevitably includes the process of depositing the graphene film 2 on the metal catalyst base 1, which may cause the following problems.

As shown in an expanded view indicated by an arrow of FIG. 1A, after the graphene film 2 is deposited on the metal catalyst base 1, wrinkles may be generated in a lamination structure of the metal catalyst base 1 and the graphene film 2. The lamination structure with the wrinkles may be obtained by depositing the graphene film 2 on the metal catalyst base 1 with the previously-generated wrinkles. Or, the lamination structure with the wrinkles may be obtained by the wrinkles generated in the metal catalyst base 1 for the process of depositing the graphene film 2 at a high temperature or the following treatment process after the deposition process of the high temperature.

If the wrinkles are generated in the lamination structure of the metal catalyst base 1 and the graphene film 2, as shown in an expanded view indicated by an arrow of FIG. 1C, after the process of etching and removing the metal catalyst base 1 from the lower surface of the graphene film 2, there may be a void defect area 2a in the graphene film 2, or an overlap defect area 2b whose thickness is uneven due to an overlapped portion of the graphene film 2. Accordingly, as shown in an expanded view indicated by an arrow of FIG. 1E, the void defect area 2a or overlap defect area 2b remains in the graphene film 2 formed on the finally-obtained target substrate 4.

If the void defect area 2a or overlap defect area 2b remains in the graphene film 2 formed on the finally-obtained target substrate 4, it is difficult to realize uniformity in the graphene film 2. As a result, the properties of surface resistance in a device with the graphene film 2 may be lowered, and device reliability may be degraded due to permeation of oxygen or moisture into the void defect area 2a.

SUMMARY

Accordingly, embodiments of the present invention are directed to an apparatus and method of manufacturing a graphene film that substantially obviates one or more problems due to limitations and disadvantages of the related art.

An aspect of embodiments of the present invention is directed to provide an apparatus and method of manufacturing a graphene film which prevents a void defect area or an overlap defect area in a graphene film finally-obtained by flattening wrinkles after a lamination process.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an apparatus of manufacturing a graphene film that may include a wrinkle flattening device configured to flatten wrinkles in a lamination structure including a base substrate and a graphene film laminated on the base substrate; and a first lamination apparatus configured to laminate a first substrate on the graphene film, wherein the wrinkle flattening device applies a vacuum to the base substrate when the wrinkle flattening device is in contact with the base substrate.

At this time, the wrinkle flattening device includes a porous suction member in contact with the base substrate. Also, the wrinkle flattening device additionally includes a support member configured to support the porous suction member, and a hollow space is prepared between the porous suction member and the support member, and a vacuum suction hole (e.g., in the support member) in communication with the hollow space.

The first lamination apparatus includes a lamination roller facing the wrinkle flattening device, and at least one of the lamination roller and the wrinkle flattening device is movable. In addition, the apparatus further includes a support roller configured to support a lower surface of the wrinkle flattening device and facing the lamination roller.

The first lamination apparatus includes a pressing apparatus provided with a body with a gas injection hole, and a pressing member connected with the body, wherein a hollow space is prepared between the body and the pressing member, and the pressing apparatus faces the wrinkle flattening device.

The wrinkle flattening device is formed of a roller structure being rotated. Also, the wrinkle flattening device includes a porous suction member of a curved-line shape structure, and a support member connected with the porous suction member, wherein the support member has a rotation structure provided inside the porous suction member.

In addition, the apparatus further includes a first supply roller, upstream from the wrinkle flattening device and the first lamination apparatus, configured to supply the lamination structure of the base substrate and the graphene film; a second supply roller, upstream from the wrinkle flattening device and the first lamination apparatus, configured to supply the first substrate; an etching apparatus, at the rear of the wrinkle flattening device and the first lamination apparatus, configured to etch the base substrate; a third supply roller, at the rear of the etching apparatus, configured to supply a second substrate; a second lamination apparatus configured to laminate the second substrate, which is supplied by the third supply roller, on the graphene film; and a peeling roller, at the rear of the etching apparatus, configured to peel the first substrate.

In another aspect of the embodiment of the present invention, there is provided a method of manufacturing a graphene film that may include flattening wrinkles in a lamination structure including a base substrate and a graphene film laminated on the base substrate; and laminating a first substrate on the graphene film, wherein the wrinkle flattening process of the lamination structure includes a vacuum suction process of the base substrate.

The vacuum suction process of the base substrate is carried out by the use of porous suction member in contact with the base substrate.

The wrinkle flattening process of the lamination structure and the lamination process of the first substrate may be continuously carried out as the lamination structure is placed onto the wrinkle flattening device.

The wrinkle flattening process of the lamination structure and the lamination process of the first substrate may be carried out at the same time as the lamination structure is placed onto the wrinkle flattening device.

In addition, after the lamination process of the first substrate, the method further includes etching and removing the base substrate; laminating the second substrate on a lower surface of the graphene film from which the base substrate is removed; and separating the first substrate from an upper surface of the graphene film.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1A:
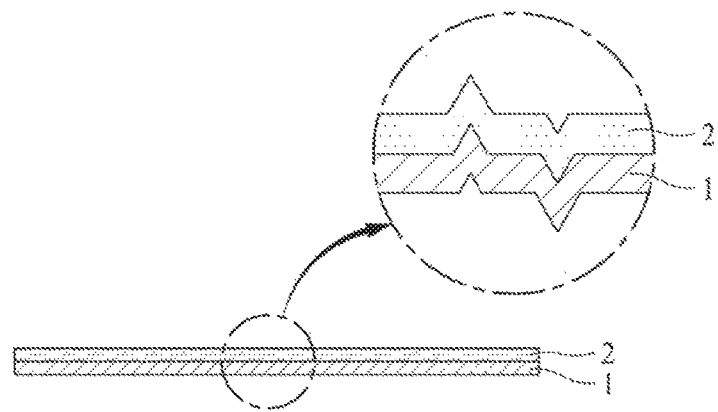
FIGS. 1A to 1E illustrate a process of forming a graphene film on a desired substrate proposed by the present applicant.
Figure 1B:
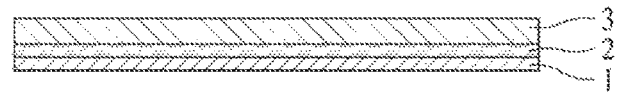
Figure 1C:
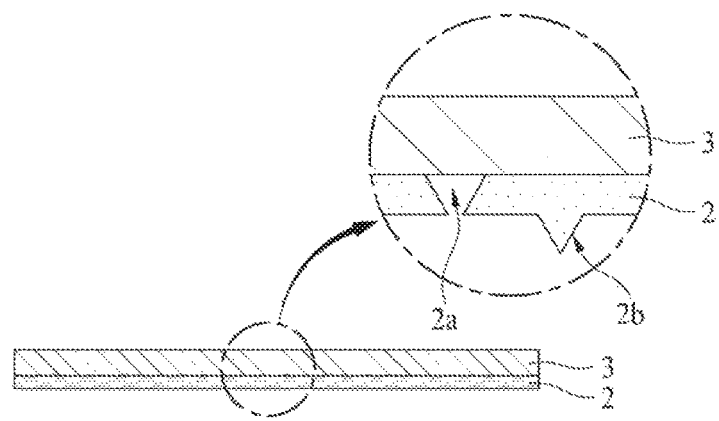
Figure 1D:
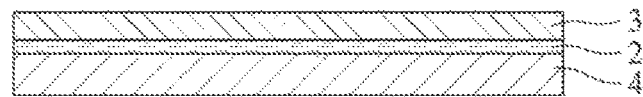
Figure 1E:
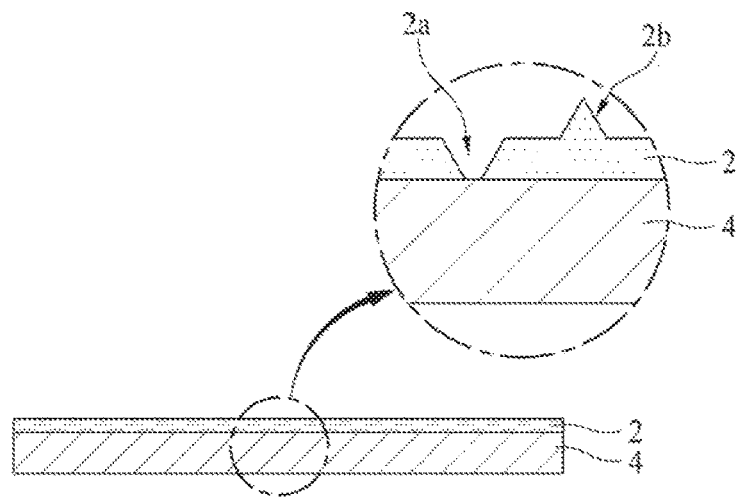

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an apparatus and method of manufacturing a graphene film according to embodiments of the present invention will be described in detail with reference to the accompanying drawings.

FIGS. 2A to 2G illustrate a method of manufacturing a graphene film according to one embodiment of the present invention.

Figure 2A:
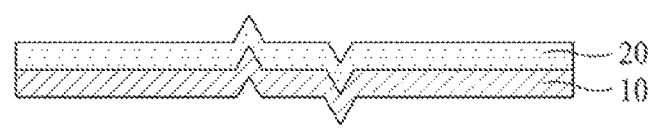
FIGS. 2A to 2G illustrate a process of manufacturing a graphene film according to one embodiment of the present invention.

First, as shown in FIG. 2A, a graphene film 20 is formed on a base substrate 10.

The base substrate 10 may be formed of a catalyst material for forming the graphene film 20. In detail, the base substrate 10 may be formed of at least one metal or alloys selected from Ni, Co, Fe, Pt, Au, Al, Cr, Cu, Mg, Mn, Mo, Rh, Si, Ta, Ti, W, U, V, Zr, brass, bronze, white brass, stainless steel, and a Ge-based material group. Herein, it is unnecessary to provide the base substrate 10 of the metal material. For example, the base substrate 10 may be formed of a non-metal material such as silicon. In this case, the aforementioned catalyst layer of metal or metal alloys may be additionally deposited on the non-metal material to obtain the base substrate 10.

The graphene film 20 may be deposited on an upper surface of the base substrate 10 by a chemical vapor deposition (CVD) method. In detail, the graphene film 20 may be formed in a generally-known chemical vapor deposition method, for example, Rapid Thermal Chemical Vapor Deposition (RTCVD), Inductively Coupled Plasma Chemical Vapor Deposition (ICP-CVD), Low Pressure Chemical Vapor Deposition; (LPCVD), Atmospheric Pressure Chemical Vapor Deposition (APCVD), Metal Organic Chemical Vapor Deposition (MOCVD), or Plasma-enhanced chemical vapor deposition (PECVD) by the use of carbon gases such as carbon monoxide, carbon dioxide, methane, ethane, ethylene, ethanol, acetylene, propane, butane, butadiene, pentane, pentene, cyclopentadiene, hexane, cyclohexane, benzene, or toluene.

If wrinkles are already generated in the base substrate 10 before the deposition of the graphene film 20, or wrinkles are generated in the base substrate 10 for the process of depositing the graphene film 20 or the following treatment process after the deposition process of the graphene film 20, wrinkles may be generated in a lamination structure of the base substrate 10 and the graphene film 20, which is obtained by the process of FIG. 2A. The wrinkles of the lamination structure may be removed by a flattening process to be explained with reference to FIGS. 2B and 2C.

Figure 2B:
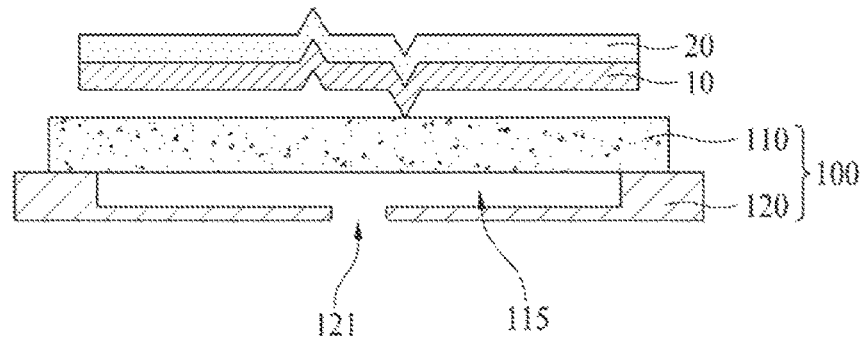

Then, as shown in FIG. 2B, the lamination structure of the base substrate 10 and the graphene film 20 is placed onto a wrinkle flattening device 100.

When the wrinkle flattening device 100 is not in contact with the graphene film 20 but in contact with the base substrate 10, the wrinkle flattening device 100 puts the base substrate 10 in a vacuum state, to thereby flatten the wrinkles of the lamination structure. The wrinkle flattening device 100 may include a porous suction member 110, and a support member 120.

The porous suction member 110 is brought into contact with a lower surface of the lamination structure, to thereby suck the lower surface of the lamination structure. An upper surface of the porous suction member 110, which is in contact with the lamination structure, is flat so that it is possible to flatten the wrinkles of the lamination structure by a vacuum suction process. The porous suction member 110 may be formed of various porous materials generally known to those in the art, for example, ceramic. In case of a plurality of holes included in the porous suction member 110, a size of each hole and an interval between each of the holes may be adjusted within a range appropriate for a wrinkle flattening process of the lamination structure.

The support member 120 supports the porous suction member 110. A hollow space 115 is prepared between the support member 120 and the porous suction member 110, and the hollow space 115 is in communication with the plurality of holes included in the porous suction member 110. Also, a vacuum suction hole 121 is provided in the support member 120, and the vacuum suction hole 121 is in communication with the hollow space 115. According as the vacuum suction is made in the vacuum suction hole 120, the vacuum suction is also made in the hollow space 115, and the plurality of holes of the porous suction member 110 in communication with the hollow space 115, to thereby flatten the wrinkles of the lamination structure. The vacuum suction hole 121 varies in position. Although not shown, a vacuum pump may be connected with the vacuum suction hole 121.

Figure 2C:
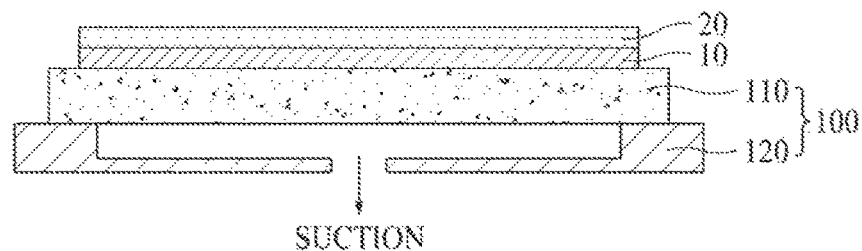

Then, as shown in FIG. 2C, the wrinkles in the lamination structure of the base substrate 10 and the graphene film 20 are flattened by the wrinkle flattening device 100.

In detail, according as the vacuum suction process is carried out through the vacuum suction hole 120, the lamination structure placed onto the porous suction member 110 is sucked in a vacuum state, whereby the wrinkles of the lamination structure are flattened. A vacuum suction level of the vacuum suction process may be adjusted within a range appropriate for the wrinkle flattening process of the lamination structure.

Figure 2D:
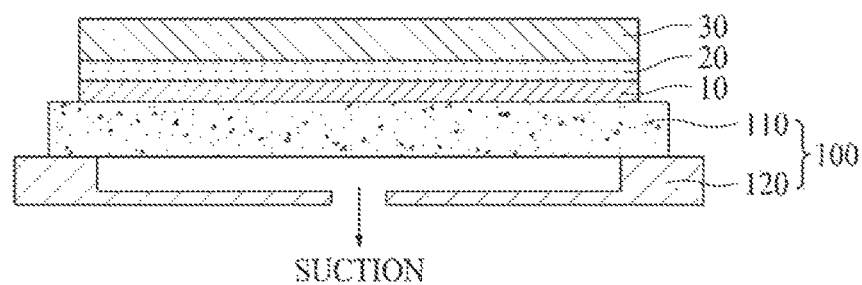

Then, as shown in FIG. 2D, a first substrate 30 is laminated on the lamination structure whose wrinkles are flattened. The first substrate 30 is laminated on an upper surface of the graphene film 20. Accordingly, the base substrate 10 is formed on a lower surface of the graphene film 20, and the first substrate 30 is formed on the upper surface of the graphene film 20.

The lamination process of the first substrate 30 and the wrinkle flattening process may be carried out continuously, or the lamination process of the first substrate 30 and the wrinkle flattening process may be carried out at the same time. That is, when the lamination structure of the base substrate 10 and the graphene film 20 is placed onto the wrinkle flattening device 100, the wrinkles of the lamination structure are flattened, and then the lamination process of the first substrate 30 is carried out. If needed, the wrinkle flattening process of the lamination structure and the lamination process of the first substrate 30 may be carried out at the same time.

The lamination process of the first substrate 30 may be carried out by various lamination processes generally known to those in the art by the use of lamination apparatus such as a roll. The first substrate 30 may be formed of a material which is not damaged by an etchant used for an etching process of the base substrate 10. For example, the first substrate 30 may be formed of polydimethylsiloxane (PDMS), but not limited to this material. The first substrate 30 may be laminated on the upper surface of the graphene film 20 by the use of adhesive. The adhesive may be various kinds of adhesive generally known to those in the art, for example, rubber-based polymer, silicon-based polymer, or acryl-based polymer.

Figure 2E:

As shown in FIG. 2E, the base substrate 10, which is formed on the lower surface of the graphene film 20, is removed by the etching process, to thereby obtain the lamination structure in which the first substrate 30 is laminated on the upper surface of the graphene film 20.

The etching process may be carried out by immersing the lamination structure of the base substrate 10, the graphene film 20 and the first substrate 30 into an etching solution. The etching solution may be a solution capable of selectively etching the base substrate 10. For example, the etching solution may be $(NH_4)_2S_2O_8$, HF, BOE, $Fe(NO_3)_3$, $FeCl_3$, or $CuCl_2$, but not limited to these materials.

Figure 2F:
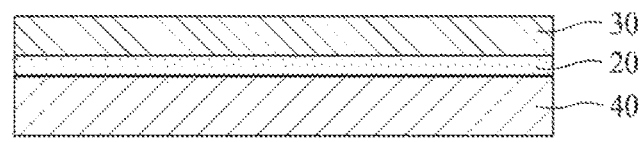

Then, as shown in FIG. 2F, the second substrate 40 is laminated on the lower surface of the graphene film 20 from which the base substrate 10 is removed.

The lamination process of the second substrate 40 may be carried out by various lamination processes generally known to those in the art by the use of pressing apparatus such as a roll. The second substrate 40 corresponds to a target substrate applied to a final device. For example, the second substrate 40 may be formed of a glass substrate or a plastic substrate. The plastic substrate may be formed of Polyethylene Terephthalate (PET), Polyimide, Polyethylene naphthalate (PEN), or Polycarbonate (PC), but not limited to these materials.

The second substrate 40 may be laminated on the lower surface of the graphene film 20 by the use of various kinds of adhesive generally known to those in the art, for example, rubber-based polymer, silicon-based polymer, or acryl-based polymer.

Figure 2G:
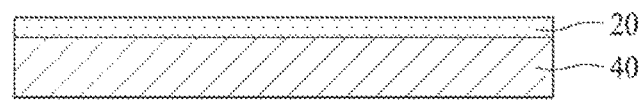

Then, as shown in FIG. 2G, the first substrate 30 is separated (peeled-off) from the upper surface of the graphene film 20, to thereby obtain the lamination structure in which the graphene film 20 is formed on the desired second substrate 40.

The above process of separating the first substrate 30 may be carried out by various kinds of thin film method generally known to those in the art, for example, a transfer method of the first substrate 30.

As shown in the drawings, the process of separating the first substrate 30 shown in FIG. 2G may be carried out after the lamination process of the second substrate 40 shown in FIG. 2F, or the lamination process of the second substrate 40 and the process of separating the first substrate 30 may be carried out at the same time. For example, after the process of FIG. 2E, a supply roller wound with the second substrate 40 is positioned on the lower surface of the graphene film 20, and a peeling roller (separating roller) is positioned on the upper surface of the first substrate 30, and then the lamination structure of the graphene film 20 and the first substrate 30 passes through the space between the supply roller and the peeling roller, whereby the second substrate 40 is laminated on the lower surface of the graphene film 20, and the first substrate 30 is separated from the upper surface of the graphene film 20, at the same time.

Hereinafter, the wrinkle flattening device and the lamination apparatus according to the embodiments of the present invention, which are provided to laminate the first substrate 30 on the graphene film 20 and to flatten the wrinkles in the lamination structure of the base substrate 10 and the graphene film 20 shown in FIGS. 2B to 2D, will be described in detail as follows.

Figure 3:
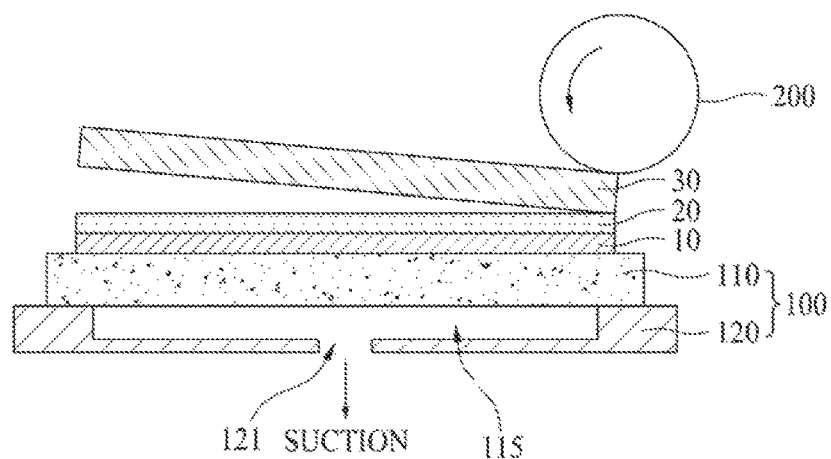
FIG. 3 illustrates a wrinkle flattening device and a lamination apparatus according to one embodiment of the present invention.

FIG. 3 illustrates the wrinkle flattening device and the lamination apparatus according to one embodiment of the present invention.

As shown in FIG. 3, the lamination structure of the base substrate 10 and the graphene film 20 is placed onto the wrinkle flattening device 100, and a lamination roller 200 is disposed on the lamination structure.

The wrinkle flattening device 100 may include the porous suction member 110 and the support member 120, which is the same as the aforementioned wrinkle flattening device, whereby a detailed description for the same parts will be omitted.

The lamination roller 200, which faces the wrinkle flattening device 100, is provided on the wrinkle flattening device 100. According as the first substrate 30 is pressed by the lamination roller 200, the first substrate 30 may be laminated on the upper surface of the graphene film 20. The lamination roller 200 may be moved while being rotated. Instead of the lamination roller 200, the wrinkle flattening device 100 may be moved. Both the lamination roller 200 and the wrinkle flattening device 100 may be moved.

Referring to FIG. 3, when the lamination structure of the base substrate 10 and the graphene film 20 is placed onto the wrinkle flattening device 100, the wrinkle of the lamination structure is flattened, and then the lamination process of the first substrate 30 is carried out by the use of lamination roller 200. In this case, the wrinkle flattening process may be carried out when the first substrate 30 is placed onto the graphene film 20, or the lamination process of the first substrate 30 may be carried out when the first substrate 30 is placed onto the graphene film 20 after the wrinkle flattening process. If needed, the wrinkle flattening process and the lamination process of the first substrate 30 may be carried out at the same time when the first substrate 30 is placed onto the graphene film 20.

Figure 4A:
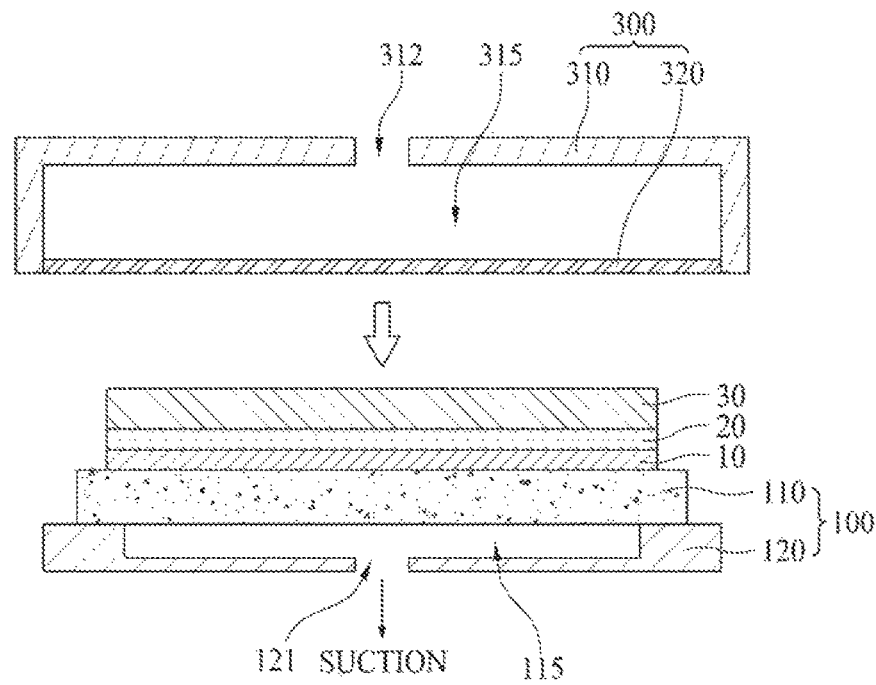
FIGS. 4A and 4B illustrate a wrinkle flattening device and a lamination apparatus according to another embodiment of the present invention.
Figure 4B:
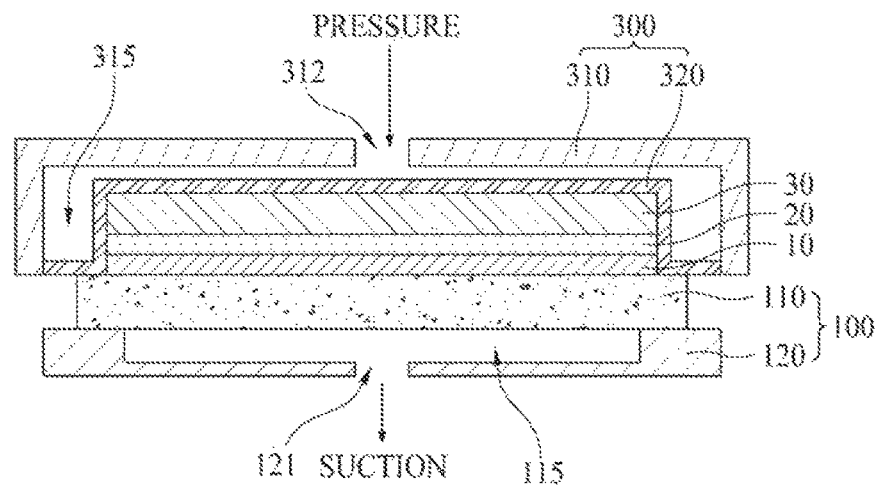

FIGS. 4A and 4B illustrate the wrinkle flattening device and the lamination apparatus according to another embodiment of the present invention, respectively.

As shown in FIGS. 4A and 4B, the lamination structure of the base substrate 10 and the graphene film 20 is placed onto the wrinkle flattening device 100, and a pressing apparatus 300 is disposed on the lamination structure.

The wrinkle flattening device 100 may include the porous suction member 110 and the support member 120, which is the same as the aforementioned wrinkle flattening device, whereby a detailed description for the same parts will be omitted.

The pressing apparatus 300, which faces the wrinkle flattening device 100, is provided on the wrinkle flattening device 100. The pressing apparatus 300 may include a body 310, and a pressing member 320 connected with the body 310.

The body 310 is provided with a gas injection hole 312 for injecting a pressing gas. Between the body 310 and the pressing member 320, there is a hollow space 315 in communication with the gas injection hole 312. Thus, the gas injected through the gas injection hole 312 presses the pressing member 320 via the hollow space 315.

The pressing member 320 is expanded by the gas injected through the gas injection hole 312, whereby the pressing member 320 covers an upper surface of the lamination structure, and then presses the lamination structure. In this reason, the pressing member 320 may be formed of an easily-stretchable material, for example, silicon rubber.

As shown in FIGS. 4A and 4B, the wrinkle of the lamination structure is flattened when the lamination structure of the base substrate 10 and the graphene film 20 is placed onto the wrinkle flattening device 100, and then the lamination process of the first substrate 30 is carried out by the expansion of the pressing member 320 while the pressing apparatus 300 is moved to a direction of the first substrate 30. In this case, the wrinkle flattening process may be carried out when the first substrate 30 is placed onto the graphene film 20, or the lamination process of the first substrate 30 may be carried out when the first substrate 30 is placed onto the graphene film 20 after the wrinkle flattening process. If needed, the wrinkle flattening process and the lamination process of the first substrate 30 may be carried out at the same time when the first substrate 30 is placed onto the graphene film 20.

Figure 5:
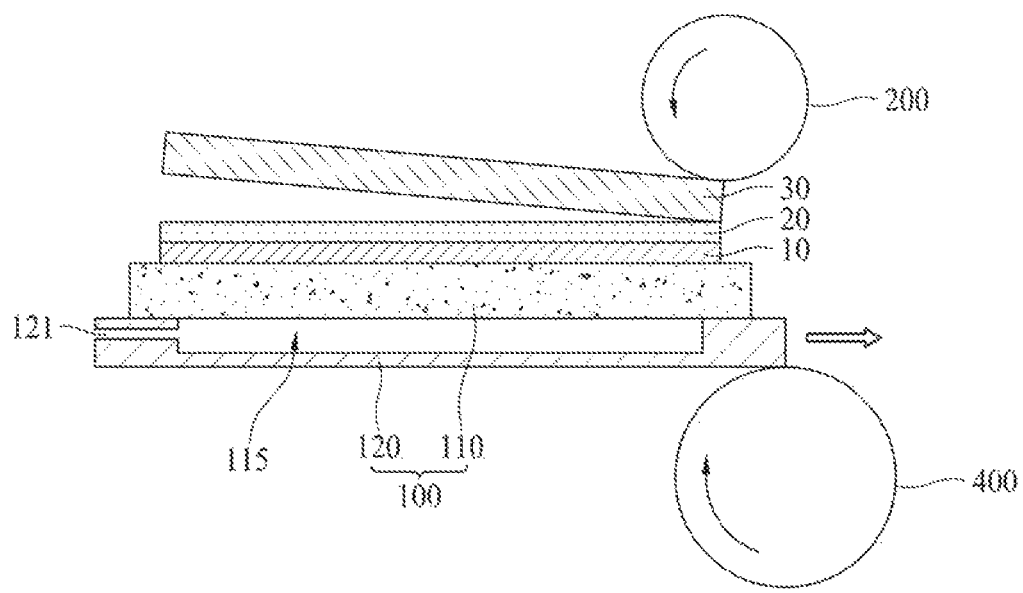
FIG. 5 illustrates a wrinkle flattening device and a lamination apparatus according to another embodiment of the present invention.

FIG. 5 illustrates the wrinkle flattening device and the lamination apparatus according to another embodiment of the present invention.

As shown in FIG. 5, the lamination structure of the base substrate 10 and the graphene film 20 is placed onto the wrinkle flattening device 100, a lamination roller is disposed on the lamination structure, and a support roller 400 is disposed under the wrinkle flattening device 100.

The wrinkle flattening device 100 may include the porous suction member 110 and the support member 120. The vacuum suction hole 121 provided in the support member 120 may be formed not in a lower surface of the support member 120, but in a lateral surface of the support member 120. Except this structure, the wrinkle flattening device 120 is the same as the aforementioned wrinkle flattening device, whereby a detailed description for the same parts will be omitted.

The lamination roller 200, which faces the wrinkle flattening device 100, is provided on the wrinkle flattening device 100. According as the first substrate 30 is pressed by the lamination roller 200, the first substrate 30 may be laminated on the upper surface of the graphene film 20.

The support roller 400 supports the lower surface of the wrinkle flattening device 100, and faces the lamination roller 200. The wrinkle flattening process of the lamination structure and the lamination process of the first substrate 30 are carried out while the wrinkle flattening device 100 and the lamination structure are moved to the space between the lamination roller 200 and the support roller 400.

According to FIG. 5, the wrinkle of the lamination structure is flattened when the lamination structure of the base substrate 10 and the graphene film 20 is placed onto the wrinkle flattening device 100, and then the lamination process of the first substrate 30 is carried out while the wrinkle flattening device 100 and the lamination structure are moved to the space between the lamination roller 200 and the support roller 400. If needed, the wrinkle flattening process of the lamination structure and the lamination process of the first substrate 30 may be carried out at the same time.

Figure 6:
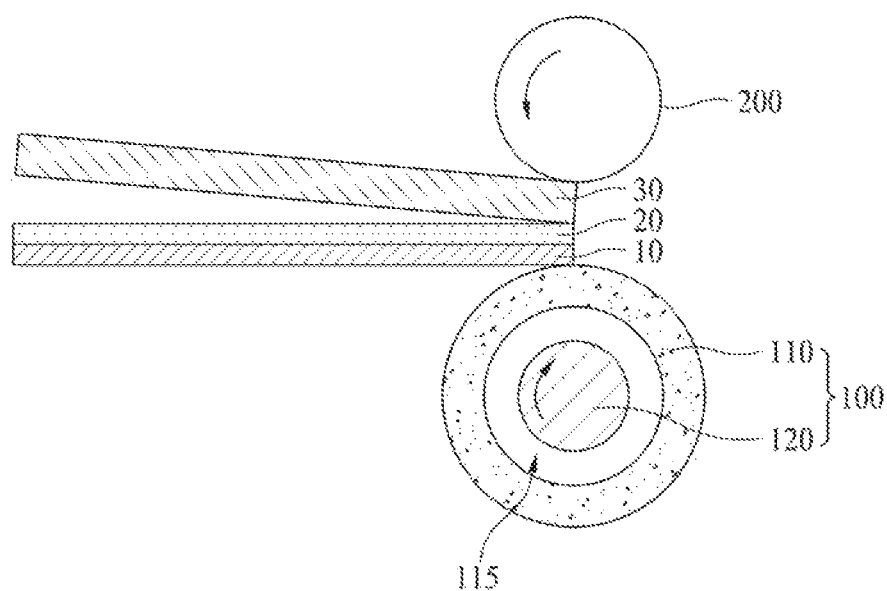
FIG. 6 illustrates a wrinkle flattening device and a lamination apparatus according to another embodiment of the present invention.

FIG. 6 illustrates the wrinkle flattening device and the lamination apparatus according to another embodiment of the present invention.

As shown in FIG. 6, the lamination structure of the base substrate 10 and the graphene film 20 is placed onto the wrinkle flattening device 100, and a lamination roller 200 is disposed on the lamination structure.

The wrinkle flattening device 100 may include the porous suction member 110 and the support member 120. The wrinkle flattening device 100 has a roller structure being rotated. Thus, the porous suction member 110 having a curved-line shaped structure such as a circle shape comes in contact with the base substrate 10. The support member 120 may be formed of a rotation structure provided inside the porous suction member 110. The support member 120 is connected with the porous suction member 110, whereby the porous suction member 120 is rotated in accordance with a rotation of the support member 120. Between the support member 120 and the porous suction member 110, there is a hollow space 115 in communication with the vacuum suction hole (not shown) provided in the support member 120.

The lamination roller 200, which faces the wrinkle flattening device 100, is provided on the wrinkle flattening device 100. According as the first substrate 30 is pressed by the lamination roller 200, the first substrate 30 may be laminated on the upper surface of the graphene film 20.

According to FIG. 6, while the lamination structure is moved to the space between the wrinkle flattening device 100 and the lamination roller 200, the wrinkle flattening process of the lamination structure and the lamination process of the first substrate 30 are carried out at the same time.

Figure 7:
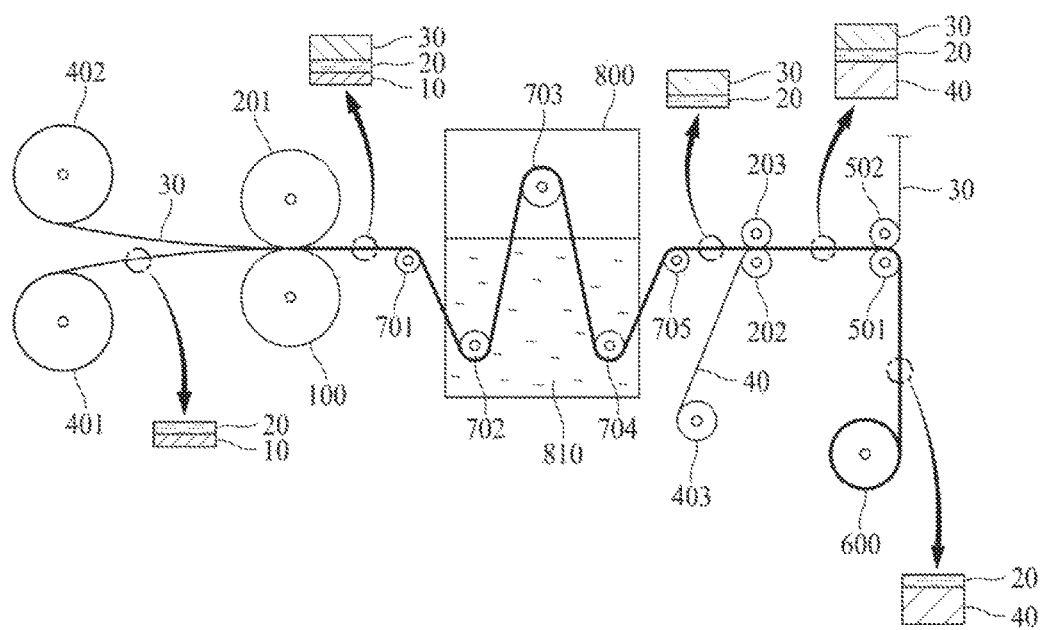
FIG. 7 illustrates an apparatus of manufacturing the graphene film according to one embodiment of the present invention, which relates to a roll-to-roll method.

FIG. 7 illustrates an apparatus of manufacturing the graphene film according to one embodiment of the present invention, which relates to a roll-to-roll method.

As shown in FIG. 7, the apparatus of manufacturing the graphene film according to one embodiment of the present invention may include a wrinkle flattening device 100, lamination rollers 201, 202 and 203, supply rollers 401, 402 and 403, peeling rollers 501 and 502, a winding roller 600, guide rollers 701, 702, 703, 704 and 705, and an etching apparatus 800.

The wrinkle flattening device 100 is provided to flatten the wrinkle in the lamination structure of the base substrate 10 and the graphene film 20. The wrinkle flattening device 100 may be formed of the aforementioned roller structure shown in FIG. 6. Although not shown in detail, the wrinkle flattening device 100 may include the porous suction member 110 and the support member 120, each of which has the curved-line shape as shown in FIG. 6. The wrinkle flattening device 100 facing the first lamination roller 201 is disposed between the etching apparatus 800 and the first and second supply rollers 401 and 402.

The lamination rollers 201, 202 and 203 may include the first lamination roller 201, the second lamination roller 202, and the third lamination roller 203. The first lamination roller 201 faces the wrinkle flattening device 100, and the first lamination roller 201 together with the wrinkle flattening device 100 laminates the first substrate 30 on the lamination structure of the base substrate 10 and the graphene film 20. In the same manner as the wrinkle flattening device 100, the first lamination roller 201 is disposed between the etching apparatus 800 and the first and second supply rollers 401 and 402. The second lamination roller 202 and the third lamination roller 203 facing each other laminate the second substrate 40 on the lower surface of the graphene film 20. The second lamination roller 202 and the third lamination roller 203 are disposed between the etching apparatus 800 and the peeling rollers 501 and 502.

The supply rollers 401, 402 and 403 may include the first supply roller 401, the second supply roller 402, and the third supply roller 403. The first supply roller 401 supplies the lamination structure of the base substrate 10 and the graphene film 20, the second supply roller 402 supplies the first substrate 30, and the third supply roller 403 supplies the second substrate 40. The first supply roller 401 and the second supply roller 402 are disposed upstream from the wrinkle flattening device 100, and the third supply roller 403 is disposed between the etching apparatus 800 and the second and third lamination rollers 202 and 203.

The peeling rollers 501 and 502 may include the first peeling roller 501 and the second peeling roller 502 facing each other. The first substrate 30 is separated along the first peeling roller 501. The peeling rollers 501 and 502 are disposed between the winding roller 600 and the second and third lamination rollers 202 and 203.

The winding roller 600 winds the lamination structure of the graphene film 20 on the second substrate 40 corresponding to a finished product. That is, the winding roller 600 is disposed in the end position.

The guide rollers 701, 702, 703, 704 and 705 guide the film or lamination structure. In the drawings, the guide rollers are provided upstream from the etching apparatus 800, at the rear of the etching apparatus 800, and inside the etching apparatus 800. In addition, the guide rollers may be provided upstream from another apparatus and at the rear of another apparatus.

The etching apparatus 800 is provided to etch the base substrate 10 formed on the lower surface of the graphene film 20. The etching apparatus 800 is filled with a predetermined etching solution 810. The etching apparatus 800 is disposed between the wrinkle flattening device 100 and the second and third lamination rollers 202 and 203.

An operation of the apparatus of manufacturing the graphene film in the roll-to-roll method shown in FIG. 7 will be described in detail as follows.

First, The lamination structure of the base substrate 10 and the graphene film 20, which is supplied by the first supply roller 401, and the first substrate 30 supplied by the second supply roller 402 are moved to the space between the wrinkle flattening device 100 and the first lamination roller 201. By the operation of the wrinkle flattening device 100, the wrinkle in the lamination structure of the base substrate 10 and the graphene film 20 is flattened, and the first substrate 30 is laminated on the upper surface of the graphene film 20, at the same time.

Then, according as the lamination structure of the base substrate 10, the graphene film 20 and the first substrate 30 passes through the etching apparatus 800, the base substrate 10 is etched and removed.

After that, the lamination structure of the graphene film 20 and the first substrate 30 is moved to the space between the second lamination roller 202 and the third lamination roller 203, and simultaneously, the second substrate 40 supplied by the third supply roller 403 is moved to the space between the second lamination roller 202 and the third lamination roller 203. According as the second substrate 40 is laminated on the lower surface of the graphene film 20, it is possible to obtain the lamination structure in which the second substrate 40, the graphene film 20 and the first substrate 30 are sequentially laminated.

Then, the lamination structure in which the second substrate 40, the graphene film 20 and the first substrate 30 are sequentially laminated is moved to the space between the first peeling roller 501 and the second peeling roller 502, whereby the first substrate 30 is separated from the graphene film 20. Accordingly, the processing is completed by obtaining the lamination structure in which the graphene film 20 is laminated on the second substrate 40, and winding the obtained lamination structure on the winding roller 600.

According to the present invention, the wrinkle in the lamination structure including the base substrate and the graphene film laminated on the base substrate is flattened through the vacuum suction process. Especially, it is possible to prevent the void defect area or overlap defect area in the finally-obtained graphene film by the vacuum suction process using the porous suction member, thereby preventing the properties of surface resistance in a device with the graphene film from being degraded, and preventing a degradation of device reliability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus for manufacturing a graphene film comprising:
    a wrinkle flattening device configured to flatten wrinkles in a lamination structure including a base substrate and a graphene film on the base substrate;
    a lamination roller facing the wrinkle flattening device and configured to simultaneously laminate a first substrate on the graphene film when the lamination structure is on the wrinkle flattening device and the wrinkle flattening device is flattening the wrinkles; and
    a support roller facing the lamination roller, the support roller being configured to support a lower surface of the wrinkle flattening device,
    wherein the wrinkle flattening device comprises:
        a porous member including a plurality of holes therein configured to apply a vacuum to substantially an entire lower surface of the base substrate,
        a support member configured to support the porous member, contacting a peripheral area of a lower surface of the porous member,
        a first hollow space between the support member and an entire remaining area of the lower surface of the porous member except for the peripheral area, the first hollow space being in communication with the plurality of holes in the porous member, and
        a vacuum suction hole in a lateral surface of the support member and in communication with the first hollow space; and
    wherein the porous member contacts the base substrate of the lamination structure, the wrinkle flattening device applies the vacuum to the base substrate through the porous member when the porous member is in contact with the base substrate, and the wrinkle flattening device is movable between the lamination roller and the support roller.

2. The apparatus according to claim 1, wherein the wrinkle flattening device comprises a rotatable roller.

3. The apparatus according to claim 2, wherein the porous member has a curved shape, and the support member has a rotation structure inside the porous suction member.

4. The apparatus according to claim 2, wherein the lamination roller and the rotatable roller simultaneously laminate the first substrate on the graphene film and flatten the wrinkles of the lamination structure as the lamination structure moves to a space between the rotatable roller and the lamination roller.

5. The apparatus according to claim 1, further comprising:
a first supply roller upstream from the wrinkle flattening device and the first lamination apparatus, configured to supply the lamination structure;
a second supply roller upstream from the wrinkle flattening device and the first lamination apparatus, configured to supply the first substrate;
an etching apparatus downstream from the wrinkle flattening device and the first lamination apparatus, configured to etch the base substrate;
a third supply roller downstream from the etching apparatus, configured to supply a second substrate;
a second lamination apparatus configured to laminate the second substrate supplied by the third supply roller on the graphene film; and
a peeling roller at the rear of the etching apparatus, configured to peel the first substrate from the graphene film.

6. The apparatus according to claim 1, wherein the porous member comprises a porous material.

7. The apparatus according to claim 6, wherein the porous member comprises a ceramic.

8. The apparatus according to claim 6, wherein the porous member is flat.

9. The apparatus according to claim 1, wherein a size of each of the plurality of holes in the porous member and an interval between the holes in the plurality of holes in the porous member are within a range appropriate for a wrinkle flattening process applied to the lamination structure.

10. The apparatus according to claim 1, further comprising a vacuum pump connected to the vacuum suction hole.

11. The apparatus according to claim 1, wherein the base substrate comprises a catalyst for forming the graphene film comprising at least one metal or alloy selected from Ni, Co, Fe, Pt, Au, Al, Cr, Cu, Mg, Mn, Mo, Rh, Si, Ta, Ti, W, U, V, Zr, brass, bronze, white brass, stainless steel, and a Ge-based material, and the first substrate comprises a material that is not damaged by an etchant used in a process of etching the base substrate.

12. The apparatus according to claim 1, wherein the lamination roller moves while rotating.

13. The apparatus according to claim 1, wherein the lamination roller and the wrinkle flattening device simultaneously laminate the first substrate on the graphene film and flatten the wrinkles of the lamination structure as the wrinkle flattening device and the lamination structure move to a space between the lamination roller and the support roller.

14. The apparatus according to claim 1, wherein the support roller is under the wrinkle flattening device.

* * * * *